US008341836B2

(12) United States Patent
Nakazawa et al.

(10) Patent No.: US 8,341,836 B2
(45) **Date of Patent: *Jan. 1, 2013**

(54) MANUFACTURING METHOD OF AN AIRTIGHT CONTAINER

(75) Inventors: Tomonori Nakazawa, Atsugi (JP); Kinya Kamiguchi, Kamakura (JP); Toshimitsu Kawase, Ebina (JP); Nobuhiro Ito, Yamato (JP); Mitsutoshi Hasegawa, Yokohama (JP); Koichiro Nakanishi, Tokyo (JP); Kazuo Koyanagi, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 417 days.

This patent is subject to a terminal disclaimer.

(21) Appl. No.: 12/689,484

(22) Filed: Jan. 19, 2010

(65) Prior Publication Data

US 2010/0186350 A1 Jul. 29, 2010

(30) Foreign Application Priority Data

Jan. 23, 2009 (JP) ................................ 2009-012911

(51) Int. Cl.
*H01R 9/00* (2006.01)
*H05K 3/00* (2006.01)

(52) U.S. Cl. ................ 29/842; 29/428; 29/509; 29/841; 445/24; 445/25; 445/38

(58) Field of Classification Search .................... 29/842, 29/428, 509, 841, 888.3; 445/24, 25, 38, 445/41
See application file for complete search history.

(56) References Cited

U.S. PATENT DOCUMENTS

| | | | | |
|---|---|---|---|---|
| 4,135,789 | A | 1/1979 | Hall | |
| 4,582,210 | A | 4/1986 | Morimoto et al. | |
| 5,059,148 | A | 10/1991 | McKenna et al. | |
| 6,146,228 | A | 11/2000 | Mougin et al. | |
| 6,261,145 | B1 | 7/2001 | Lee et al. | 445/25 |
| 6,459,198 | B1 | 10/2002 | Dean et al. | |
| 7,245,071 | B2 * | 7/2007 | Kamiguchi | 313/495 |
| 2003/0085651 | A1 | 5/2003 | Takahashi | |
| 2003/0227252 | A1 | 12/2003 | Ikeya et al. | |
| 2006/0028119 | A1 | 2/2006 | Kamiguchi | |
| 2009/0313946 | A1 | 12/2009 | Guo et al. | |

FOREIGN PATENT DOCUMENTS

JP 04-061745 A 2/1992

(Continued)

OTHER PUBLICATIONS

European Search Report dated Nov. 5, 2010, in related corresponding European Patent Application No. 10151276.2.

(Continued)

*Primary Examiner* — Thiem Phan

(74) *Attorney, Agent, or Firm* — Fitzpatrick, Cella, Harper & Scinto

(57) ABSTRACT

An airtight container manufacturing method includes the steps of (a) exhausting an inside of a container through the through-hole; (b) arranging a spacer along a periphery of the through-hole on an outer surface of the container the inside of which has been exhausted; (c) arranging a plate so that the spacer and the through-hole are covered by the plate and a gap is formed along a side surface of the spacer between the plate and the container outer surface; and (d) arranging the cover to cover the plate and bonding the cover and the container outer surface via sealant positioned between the cover and the container outer surface. The sealing includes hardening the sealant after deforming the sealant by pressing the plate with the cover so that the gap is infilled with the sealant.

7 Claims, 6 Drawing Sheets

FOREIGN PATENT DOCUMENTS

| | | | |
|---|---|---|---|
| JP | 5-314906 | A | 11/1993 |
| JP | 2002-143000 | A | 5/2002 |
| JP | 2003-192399 | | 7/2003 |

OTHER PUBLICATIONS

U.S. Appl. No. 13/357,001, filed Jan. 24, 2012, Mamo Matsumoto.
U.S. Appl. No. 13/198,867, filed Aug. 5, 2011, Mamo Matsumoto.
U.S. Appl. No. 13/226,741, filed Sep. 7, 2011, Mamo Matsumoto.
U.S. Appl. No. 12/178,230, filed Jul. 23, 2008, Kazuo Koyanagi, et al.
U.S. Appl. No. 12/689,450, filed Jan. 19, 2010, Kinya Kamiguchi, et al.
U.S. Appl. No. 12/689,467, filed Jan. 19, 2010, Kinya Kamiguchi, et al.

* cited by examiner

MANUFACTURING METHOD OF AN AIRTIGHT CONTAINER

BACKGROUND OF THE INVENTION

1. Field of the Invention

The present invention relates to a manufacturing method of an airtight container. In particular, the present invention relates to a manufacturing method of a vacuum airtight container (envelope) used for a flat panel image displaying apparatus.

2. Description of the Related Art

An image displaying apparatus, in which a number of electron-emitting devices for emitting electrons according to image signals are provided on a rear plate and a fluorescent film for displaying an image by emitting light in response to irradiation of electrons is provided on a face plate, and of which the inside is maintained with vacuum, has been known. In the image displaying apparatus like this, generally, the face plate and the rear plate are bonded to each other through a support frame, thereby forming an envelope. In case of manufacturing the image displaying apparatus like this, it is necessary to exhaust the inside of the envelope to secure a vacuum. Such an exhausting process can be achieved by several kinds of methods. As one of these methods, a method of exhausting the inside of a container through a through-hole provided on the surface of the container and thereafter sealing the through-hole by a cover member has been known.

In case of sealing the through-hole by the cover member, it is necessary to arrange a sealant around the through-hole to obtain a sealing effect. Here, several kinds of methods of arranging the sealant have been known. When one of these methods is applied to a vacuum airtight container, it is desirable to select the method which can prevent the sealant from flowing into the through-hole. This is because, although it is necessary to heat and then soften or melt the sealant to uniformly arrange and form it around the through-hole, there is a fear at this time that the sealant flows into the through-hole due to a difference between internal and external pressures of the container. In particular, in case of manufacturing the envelope of the image displaying apparatus, the sealant which has flowed inside the through-hole accounts for an electrical discharge phenomenon.

Here, Japanese Patent Application Laid-Open No. 2003-192399 (called a patent document 1 hereinafter) discloses a technique for tapering the face of a cover member opposite to a through-hole. More specifically, in the patent document 1, the distance between the tapered face and the face on which the through-hole has been formed becomes wider as the tapered face goes apart from the periphery of the through-hole. Then, a melted sealant is deformed due to the weight of the sealant itself, and the deformed sealant moves toward the tapered portion, thereby restraining the sealant from flowing into the through-hole.

U.S. Pat. No. 6,261,145 (called a patent document 2 hereinafter) discloses a technique for closing up a circular through-hole by a spherical metal cap or the like, externally filling up a sealant to the contact portion between the through-hole and the metal cap, and thus sealing the through-hole. More specifically, in the patent document 2, since the cap is fit into the tapered through-hole, the force toward the inside of a container is applied to the cap if the inside of the cap is vacuum. Thus, since the cap is in tight contact with the through-hole easily, it becomes difficult for the sealant to flow into the through-hole.

In the patent document 1, since the sealant directly faces the through-hole, there is a strong possibility that the sealant flows into the through-hole when it is melted. More specifically, although most sealant flows into the tapered portion, there is a possibility that a part of the sealant flows into the through-hole due to the vacuum inside the container. In the patent document 2, the sealant is applied merely to the vicinity of the cap. That is, unlike the patent document 1, the patent document 2 does not include any process of pressing the sealant. For this reason, since it is difficult in the patent document 2 to uniformly distribute the sealant, there is a possibility that it is difficult to obtain sufficient sealing performance.

SUMMARY OF THE INVENTION

The present invention aims, in a manufacturing method of an airtight container including a process of sealing a through-hole by a cover member, to provide the manufacturing method which can secure sealing performance and also restrain a sealant from flowing into the through-hole. Moreover, the present invention aims to provide a manufacturing method of an image displaying apparatus, which uses the relevant manufacturing method of the airtight container.

An airtight container manufacturing method in the present invention comprises: (a) exhausting an inside of a container through a through-hole provided on the container; (b) arranging a spacer member along a periphery of the through-hole on an outer surface of the container the inside of which has been exhausted; (c) arranging a plate member so that the spacer member and the through-hole are covered by the plate member and a gap is formed along a side surface of the spacer member between the plate member and the outer surface of the container; and (d) arranging a cover member so as to cover the plate member and bonding the arranged cover member and the outer surface of the container to each other via a sealant positioned between the cover member and the outer surface of the container, wherein the bonding includes hardening the sealant after deforming the sealant as pressing the plate member by the cover member so that the gap is infilled with the sealant.

Another airtight container manufacturing method in the present invention comprises: (a) exhausting an inside of a container through a through-hole provided on the container, and preparing a laminated body in which a spacer member, a plate member and a cover member are laminated with a sealant interposed between the plate member and the cover member; and (b) pressing the laminated body toward the outer surface of the container the inside of which has been exhausted, so that the through-hole is covered by the plate member, and bonding the cover member and the outer surface of the container to each other via the sealant, wherein the bonding includes arranging the laminated body so that a gap is formed along a side surface of the spacer member between the plate member and the outer surface of the container, and the bonding further includes hardening the sealant after deforming the sealant as pressing the plate member by the cover member so that the gap is infilled with the sealant.

A manufacturing method of an image displaying apparatus, in the present invention, comprises manufacturing an envelope an inside of which has been vacuumized, by using the airtight container manufacturing methods described as above.

According to the present invention, in the airtight container manufacturing method including sealing the through-hole by the cover member, it is possible to provide the airtight container manufacturing method which can efficiently secure the sealing performance and also restrain the sealant from flowing into the through-hole. Moreover, according to the present invention, it is possible to provide the image displaying apparatus manufacturing method which uses the airtight container manufacturing method described as above.

Further features of the present invention will become apparent from the following description of exemplary embodiments with reference to the attached drawings.

DESCRIPTION OF THE EMBODIMENTS

A manufacturing method of an airtight container of the present invention can be widely applied to a manufacturing method of an airtight container of which the inside is exhausted to be vacuumized. Particularly, the present invention can be preferably applied to a manufacturing method of an envelope of a flat panel image displaying apparatus of which the inside is exhausted to be vacuumized.

First Embodiment

The first embodiment of the present invention will be described with reference to FIGS. 1A to 1F. Here, FIGS. 1A to 1F are the schematic step views indicating a sealing process, which can be particularly preferably used in a case where a through-hole is sealed under a state that the through-hole of an airtight container is placed on the upper surface of an envelope.

(Step S1)

Figure 1A:
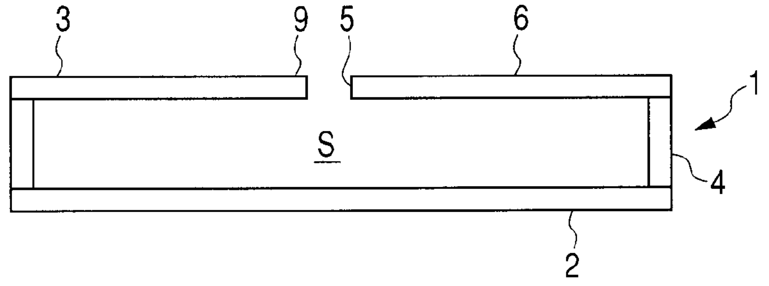
FIGS. 1A, 1B, 1C, 1D, 1E and 1F are schematic step views indicating a sealing process of the first embodiment.

Initially, an inside S of a container 1 is exhausted via a through-hole 5 provided on the surface of the container 1. The container 1 can have desired materials and constitution. In case of a flat panel image displaying apparatus, a part of the container 1 is usually manufactured by glass. In the present embodiment, as indicated in FIG. 1A, the container 1 is composed of a face plate 2, a rear plate 3 and a support frame 4, which are mutually bonded by a proper means such as a glass frit or the like, to form an airtight container. A large number of electron emitters (not illustrated) for emitting electrons in accordance with an image signal are provided on the rear plate 3. A fluorescent film (not illustrated), which emits light upon receiving irradiation of electrons and thus displays images, is provided on the face plate 2. Additionally, the through-hole 5, which is an aperture nearly equal to a circular form, is provided on the rear plate 3. The position and the size of the through-hole 5 are properly set in consideration of a desired degree of vacuum in the container 1, a desired exhausting time, and the like. In the present embodiment, only one through-hole 5 is provided, however plural through-holes may be provided. In order to improve adherence and wettability with a sealant 12 later described, a surface treatment may be performed to the circumference portion of the through-hole 5 on an outer surface 6 of the container 1 by use of an ultrasonic cleaning process, or a metal film may be deposited.

An exhaust unit of the container 1 is selected so that the inside of the container 1 becomes a desired degree of vacuum. The exhaust unit is not especially limited if the inside of the container 1 can be exhausted by the exhaust unit via the through-hole 5 and thus a process to be described later can be performed. In a case where an exhausting process is performed under a condition that the whole container 1 is set inside a vacuum-exhaust chamber, such a situation is desirable because moving mechanisms (rotating/vertical moving mechanisms 20 and 23 in the later-described examples) of later-described respective members (a plate member 8, a cover member 13, a spacer member 32, etc.) can be also provided in the same chamber.

(Step S2)

Figure 1B:
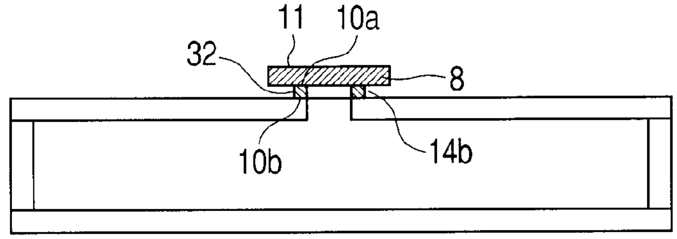

As indicated in FIG. 1B, the spacer member 32 is arranged along a periphery 9 of the through-hole 5 on the outer surface 6 of the container 1, of which the inside S has been exhausted. Next, the plate member 8 is arranged so that the spacer member 32 and the through-hole 5 are covered by the plate member 8 and a gap 14*b* is formed along the side surface of the spacer member 32 between the plate member 8 and the outer surface of the container 1. More specifically, the spacer member 32 is arranged so that the outer surface of the container 1 along the periphery of the through-hole 5 is in contact with the spacer member 32. Further, the plate member 8 is arranged so that the spacer member 32 is interposed between the outer surface of the container 1 and the plate member 8 and the through-hole 5 is covered by the plate member 8. The plate member 8 of which the size is larger than that of the through-hole 5 is a circular member of which the diameter is larger than that of the through-hole 5, in the present embodiment. Further, the spacer member 32 of which the plate area (i.e., the inner-side area of the periphery of the ring portion) is smaller than that of the plate member 8 is a ring-shaped member of which the outside diameter is smaller than that of the plate member 8 and of which the bore diameter is larger than the diameter of the through-hole 5, in the present embodiment. It is desirable that the plate member 8, the spacer member 32 and the through-hole 5 are almost concentrically arranged. A contact surface 10*a* between the plate member 8 and the spacer member 32 and a contact surface 10*b* between the spacer member 32 and the outer surface of the container 1 together prevent that the sealant 12 flows into the through-hole 5. Therefore, it is desirable that the configuration and surface roughness of each of the plate member 8, the spacer member 32 and the outer surface of the container 1 are defined so that gaps (leak paths) between the respective members at the contact surfaces 10*a* and 10*b* become tight. The thickness of the plate member 8 and the thickness of the spacer member 32 are properly defined in consideration of sealing performance and deformation characteristic of the sealant 12. In the present embodiment, it is also possible to use a plate member having a projection structure (a projection 18) as described later in the second embodiment.

(Step S3)

Figure 1C:
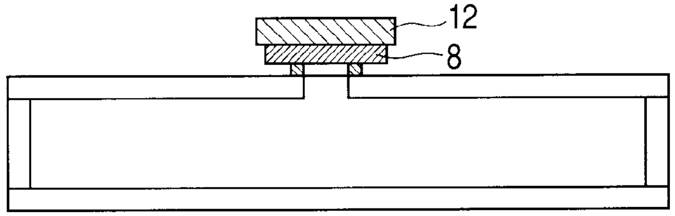

As indicated in FIG. 1C, the sealant 12 is provided on a surface 11 (refer to FIG. 1B) of the plate member 8 opposite to the contact surface 10*a* between the plate member 8 and the spacer member 32. The sufficient amount of the sealant 12 is provided so that the sealant 12 covers the plate member 8 by protruding to the outside of the plate member 8 and the sealant 12 becomes thicker than the plate member 8. The material of the sealant 12 is not especially limited if it can obtain desired sealing performance and adhesive characteristic. In the present embodiment, since the container 1 made by glass to be used in the flat panel image displaying apparatus is targeted, a glass frit, or low-melting metal such as an In alloy, a Sn alloy or the like is used as the sealant 12 in consideration of high sealing performance or stress in heating.

(Step S4)

Figure 1D:
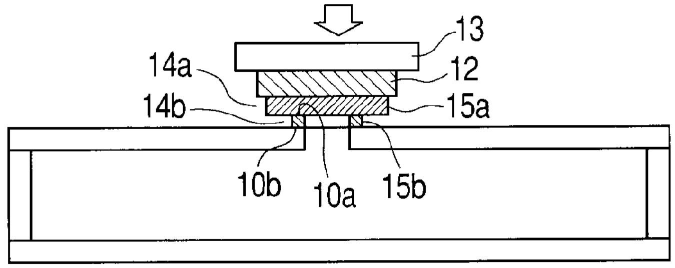
Figure 1E:
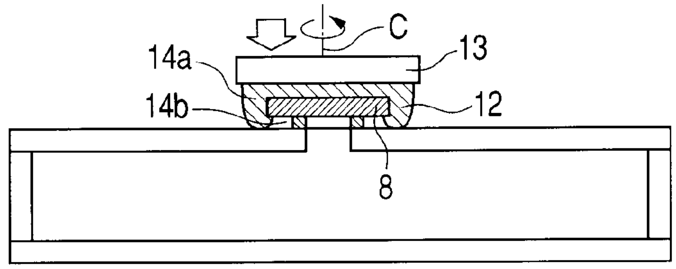
Figure 1F:
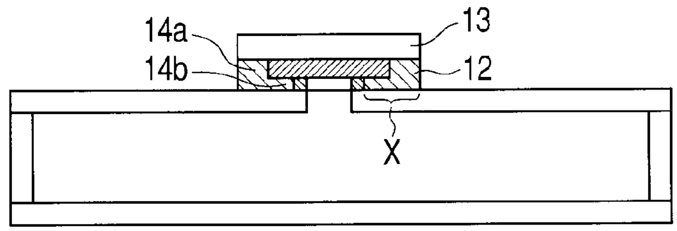

As indicated in FIG. 1D, the cover member 13 is arranged on the sealant 12. As a result of this arrangement, the cover member 13 is arranged so as to cover the plate member 8. Here, it is desirable to use the cover member 13 having a plane area larger than that of the plate member 8 so that a sufficient sealing width X (refer to FIG. 1F) can be obtained on the circumference of the plate member 8, in response to the sealing characteristic of the sealant 12. Next, as indicated in FIGS. 1E and 1F, the sealant 12 is pressed in the vertical downward direction (direction indicated by an outline arrow) by the cover member 13 to deform the sealant 12. At that time, the sealant 12 is pressed by the cover member 13 so that the sealant 12 fills up a space 14*a* between the cover member 13 and the outer surface 6 of the container 1 and a space 14*b* between the plate member 8 and the outer surface 6 of the container 1 along an outer circumference portion 15*a* of the plate member 8 and an outer circumference portion 15*b* of the spacer member 32. As indicated in FIG. 1E, the sealant 12 is deformed and thus moved to the space 14*a* so that a part of the sealant 12 wraps around the outer circumference portion 15*a* of the plate member 8. Further, if the sealant 12 is further pressed by the cover member 13, the sealant 12 is moved up to the space 14*b*. Thus, as indicated in FIG. 1F, the spaces 14*a* and 14*b* are completely infilled with the sealant 12, and the width of the sealant 12 is extended to such a width nearly equal to that of the cover member 13. After that, the sealant 12 is heated, and then cooled down to be hardened.

However, the sealant 12 is not always required to be deformed to become such the condition. For example, if the predetermined sealing width X is ensured, the sealant 12 is not required to be extended to the same width as that of the cover member 13. Further, the space 14*a* between the cover member 13 and the outer surface 6 of the container 1 and the space 14*b* between the plate member 8 and the outer surface 6 of the container 1 are not always required to be infilled with the sealant. Furthermore, although the sealant 12 does not remain between the plate member 8 and the cover member 13 in FIG. 1F, a part of the sealant 12 may remain between the plate member 8 and the cover member 13.

In case of pressing the sealant 12 by the cover member 13, it is desirable to heat the sealant 12 to the temperature of melting the sealant 12 in accordance with the characteristic of the sealant 12. Herewith, a deformation performance of the sealant 12 is improved. In the present embodiment, since the whole container 1 is set within a vacuum-exhaust chamber, a convective flow in heating can not be expected, and it is thus considered that heating efficiency is deteriorated. Therefore, as an object of shortening a heating time in case of heating the sealant 12 to the melting temperature, at least one of the plate member 8, the cover member 13 and the spacer member 32 may be heated within a range that the sealant 12 is not melted before the process of deforming the sealant 12. The heat from the plate member 8, the cover member 13 or the spacer member 32 is transmitted to the sealant 12, and a heating effect for the sealant 12 can be obtained. It is desirable that the heating temperature is set so that the plate member 8, the cover member 13 or the spacer member 32 is not destroyed by a sudden change of temperature.

A method of applying the load (press force) can be properly selected. For example, such a means of using a spring, mechanically applying the press force or arranging a weight can be enumerated. In the present embodiment, although the applying of the load to keep the position of the cover member 13 and the applying of the load to deform the sealant 12 are realized by the same load, different means may be used. As to the load in this case, a force of sufficiently squashing the sealant is required so that the sealant keeps at least airtightness. When the sealant 12 is deformed, the sealant 12 may be pressed by the cover member 13 while rotating the cover member 13 around an axis parallel to the direction of pressing the sealant 12 (for example, a central axis C of the cover member 13) as a center of rotation as indicated in FIG. 1E. Thus, the sealant 12 is more effectively deformed, whereby the spaces 14*a* and 14*b* are uniformly infilled with the sealant 12.

According to the present embodiment, the sealant 12 is deformed while the plate member 8 is being pressed by the cover member 13, and then the sealant 12 is hardened, whereby sealing and bonding are completed. That is, when the sealant 12 is melted and deformed, the plate member 8 and the spacer member 32 close up the through-hole 5 while being pressed toward the through-hole 5. Therefore, the sealing performance at the contact surface 10*a* between the plate member 8 and the spacer member 32 and at the contact surface 10*b* between the spacer member 32 and the outer surface 6 of the container 1 is enhanced, whereby the melted sealant 12 becomes hard to flow into the through-hole 5. Thus, in the flat panel image displaying apparatus, when high voltage to be used to display images is applied, a discharge phenomenon caused by the sealant 12 flowing in the container can be easily prevented. Further, according to a material of the sealant 12, there is a case that the sealant 12 generates gas. However, in the present embodiment, since the sealant 12 seldom flows into the container 1, a negative influence to electron emitters and the like due to the generated gas hardly occurs.

Further, in the present embodiment, both the sealing effect at the space 14*a* between the outer surface 6 of the container 1 and the cover member 13 by the sealant 12 and the sealing effect at the space 14*b* between the plate member 8 and the outer surface 6 of the container 1 by the sealant 12 can be expected. Thus, since the two sealing portions are arranged in series as described above, the sealing performance itself is improved, and also defective airtightness can be easily prevented.

Furthermore, in the present embodiment, the total thickness of the plate member 8 and the spacer member 32 results to define the minimum value of the thickness of the sealant 12. Therefore, even if the pressing load is large in some degree, deformation of the sealant 12 is prevented to be fixed to such a level less than the total thickness of the plate member 8 and the spacer member 32, and this fact leads to an improvement of reliability of airtightness. However, to prevent destruction of the container 1, the plate member 8, the cover member 13 and the spacer member 32, it is not desirable to increase the pressing load particularly.

In the present embodiment as described above, the sealant 12 is arranged on the back surface 11 of the plate member 8. However, a sealing process may be performed by applying the sealant 12 to the side of the plate member 8 a little thicker while pressing (squashing) the sealant 12 and the plate member 8 by the cover member 13. That is, if the cover member 13 and the outer surface 6 of the container 1 are finally bonded to each other via the sealant 12 positioned at the space 14*a* and the plate member 8 and the outer surface 6 of the container 1 are finally bonded to each other via the sealant 12 positioned at the space 14*b*, the position of initially providing the sealant 12 can be properly determined.

Second Embodiment

The present embodiment is different from the first embodiment in a point that the through-hole is sealed by bringing a laminated body composed of the spacer member, the plate member, the sealant and the cover member into contact with the through-hole from the downside of the through-hole, and other points in the present embodiment are the same as those in the first embodiment. Therefore, in the following description, the point different from the first embodiment will be mainly described. Namely, as to the matters not described in the following, the description in the first embodiment should be referred.

The second embodiment of the present invention will be described with reference to FIGS. 2A to 2E. FIGS. 2A to 2E are the schematic step views indicating a sealing process which can be especially preferably used in a case where the through-hole is sealed in a state that the through-hole of the airtight container was opened to the vertical downward direction.

(Step S51)

Figure 2A:
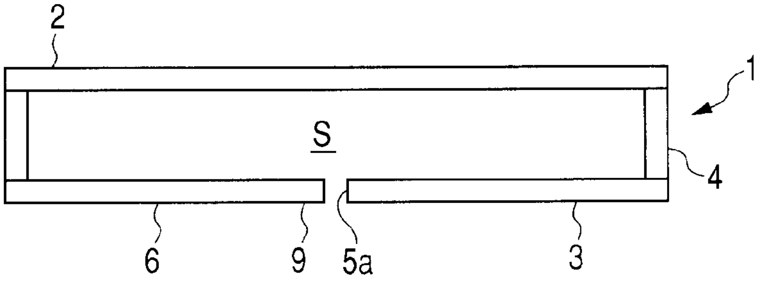
FIGS. 2A, 2B, 2C, 2D and 2E are schematic step views indicating a sealing process of the second embodiment.

As indicated in FIG. 2A, the inside of the container 1 is exhausted via the through-hole 5 provided on the surface of the container 1. This step is the same as that in the first embodiment.

(Step S52)

Figure 2B:
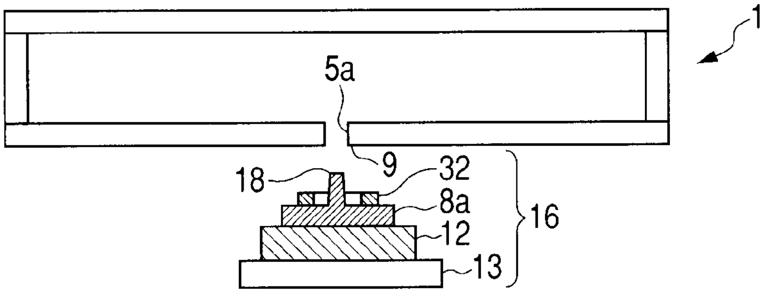

As indicated in FIG. 2B, a laminated body 16, in which a plate member 8*a* and the cover member 13 are laminated with the sealant 12 interposed between the plate member 8*a* and the cover member 13, is prepared. Here, it should be noted that the cover member 13, which is the same as that in the first embodiment, can be used. As the plate member, the plate member 8 in the first embodiment can be used. However, in the present embodiment, the plate member 8*a*, which has a cylindrical or semispherical projection 18 capable of being inserted inside a through-hole 5*a*, is used. Further, in the present embodiment, the spacer member 32, which has a ring shape, is laminated in the state that the projection 18 of the plate member 8*a* is being inserted in the spacer member 32. As will be described later, when the plate member 8*a* is pressed toward the outer surface 6 of the container 1, the projection 18 is inserted into the through-hole 5*a*. That is, the projection 18 functions as a guide when the plate member 8*a* is pressed to the through-hole 5*a*. Therefore, it is desirable that the projection 18 has such a size (diameter) to be naturally set in the through-hole 5*a*. In any case, the sealant 12, which is the same as that in the first embodiment, can be used. At a previous step before the laminated body 16 is formed, at least one of the plate member 8*a* and the cover member 13 may be heated within a range that the sealant 12 is not melted.

(Step S53)

Figure 2C:
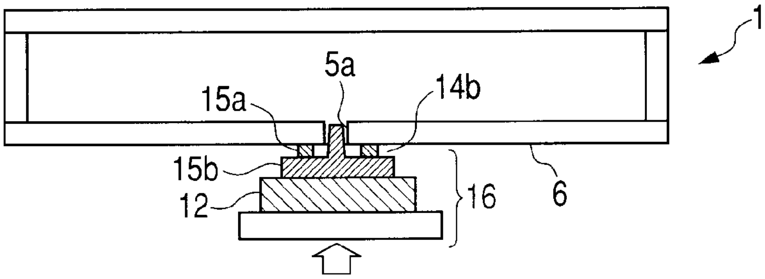

As indicated in FIG. 2C, the laminated body 16 is arranged on the outer surface 6 of the container 1 of which the inside has been exhausted so that the spacer member 32 is in contact with the outer surface 6 along the periphery (refer to FIG. 2A) of the through-hole 5*a* and the through-hole 5*a* is covered by the plate member 8*a*. Here, the laminated body 16 is arranged so that the space 14*b* along the side surface of the spacer member 32 is formed between the plate member 8*a* and the outer surface 6 of the container 1. The above operation is performed in a state that the through-hole 5*a* is opened in the vertical downward direction, as described above. Since the projection 18 is inserted in the through-hole 5*a* and the spacer member 32, positioning is easily performed. At this time, according to a characteristic of the sealant 12, the whole or a part of the laminated body 16 may be heated to the extent that the sealant 12 is not melted.

(Step S54)

Figure 2D:
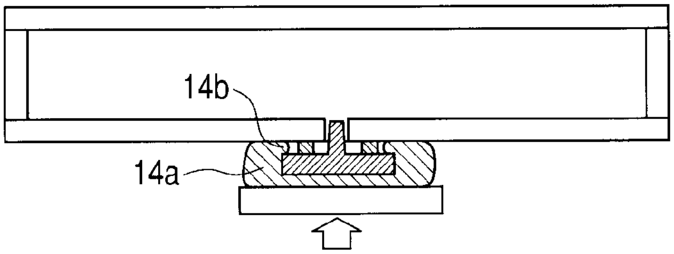
Figure 2E:
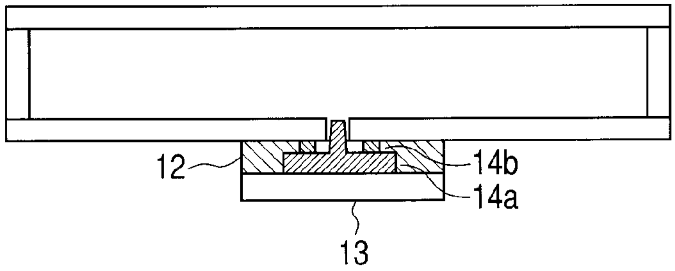

As indicated in FIG. 2D, the sealant 12 is pressed in the vertical upward direction (i.e., the direction indicated by the outline arrow) by the cover member 13. A means of applying load can be properly selected as well as the first embodiment. While maintaining this condition, the sealant 12 is heated to a temperature of melting the sealant 12. The melted sealant 12 is then deformed so that the space 14*a* between the cover member 13 and the outer surface 6 of the container 1 and the space 14*b* between the plate member 8*a* and the outer surface 6 of the container 1 are respectively infilled with the sealant 12 along an outer circumference portion 15*a* of the spacer member 32 and an outer circumference portion 15*b* of the plate member 8*a*. More specifically, when the sealant 12 is pressed by the cover member 13, as indicated in FIG. 2D, a part of the sealant 12 is moved to the lateral direction of the plate member 8*a* while the sealant 12 is being deformed. Further, another part of the sealant 12 is dragged by the cover member, and thus extended to the lateral direction. When the sealant 12 is further pressed by the cover member 13, as indicated in FIG. 2E, the spaces 14*a* and 14*b* are completely infilled with the sealant 12, and the width of the sealant 12 is extended to such a width nearly equal to that of the cover member 13. Thereafter, the sealant 12 is heated, and then cooled down to be hardened. As just described, in the present embodiment, the laminated body is pressed so that the plate member closes up the through-hole, and the cover member and the outer surface of the container are bonded via the sealant, whereby the container 1 is sealed. Further, a fact that the sealing process includes a process of hardening the sealant after deforming the sealant while pressing the plate member by the cover member is substantially the same as that in the first embodiment.

In the present embodiment, the through-hole can be sealed in a state that the through-hole is opened in the vertical downward direction, and the same effect as that in the first embodiment can be achieved. That is, the melted sealant 12 hardly flows into the through-hole 5*a*. Thus, in the flat panel image displaying apparatus, a discharge phenomenon caused by the sealant 12 flowing in the apparatus can be easily prevented. A negative influence to the electron emitter or the like due to gas hardly occurs. Further, sealing performance itself is improved, and defective airtightness can be easily prevented. Even if the pressing load is large in some degree, it can be prevented that the sealant 12 is deformed to have a thickness equal to or less than the total thickness of the plate member 8*a* and the spacer member 32, thereby improving reliability of airtightness. Further, in the present embodiment, a process of sequentially providing the spacer member 32, the plate member 8*a*, the sealant 12 and the cover member 13 is not required, and a process of forming the laminated body 16 can be individually performed. Therefore, also an effect capable of rationalizing the sealing process is obtained.

Incidentally, in the present embodiment, the laminated body composed of the spacer member, the plate member, the sealant and the cover member is brought into contact with the airtight container from the downward side. However, the present invention is not limited to this. That is, the laminated body may be brought into contact with the airtight container from the upward side or the horizontal side according to a position of the through-hole. Incidentally, as described in the first embodiment, in case of deforming the sealant 12, it is possible also in the present embodiment to press the sealant 12 by the cover member 13 while rotating the cover member 13 around the axis being in parallel with the direction in which the sealant 12 is pressed. Further, it is possible to heat at least one of the plate member, the cover member and the spacer member before the process of deforming the sealant is performed.

In the present embodiment, the spacer member is provided independently of the plate member. However, the same effect can be obtained even if the spacer member and the plate member are integrated. In addition, working processes can be totally reduced.

Hereinafter, the present invention will be described in detail as specific examples.

Example 1

Figure 3:
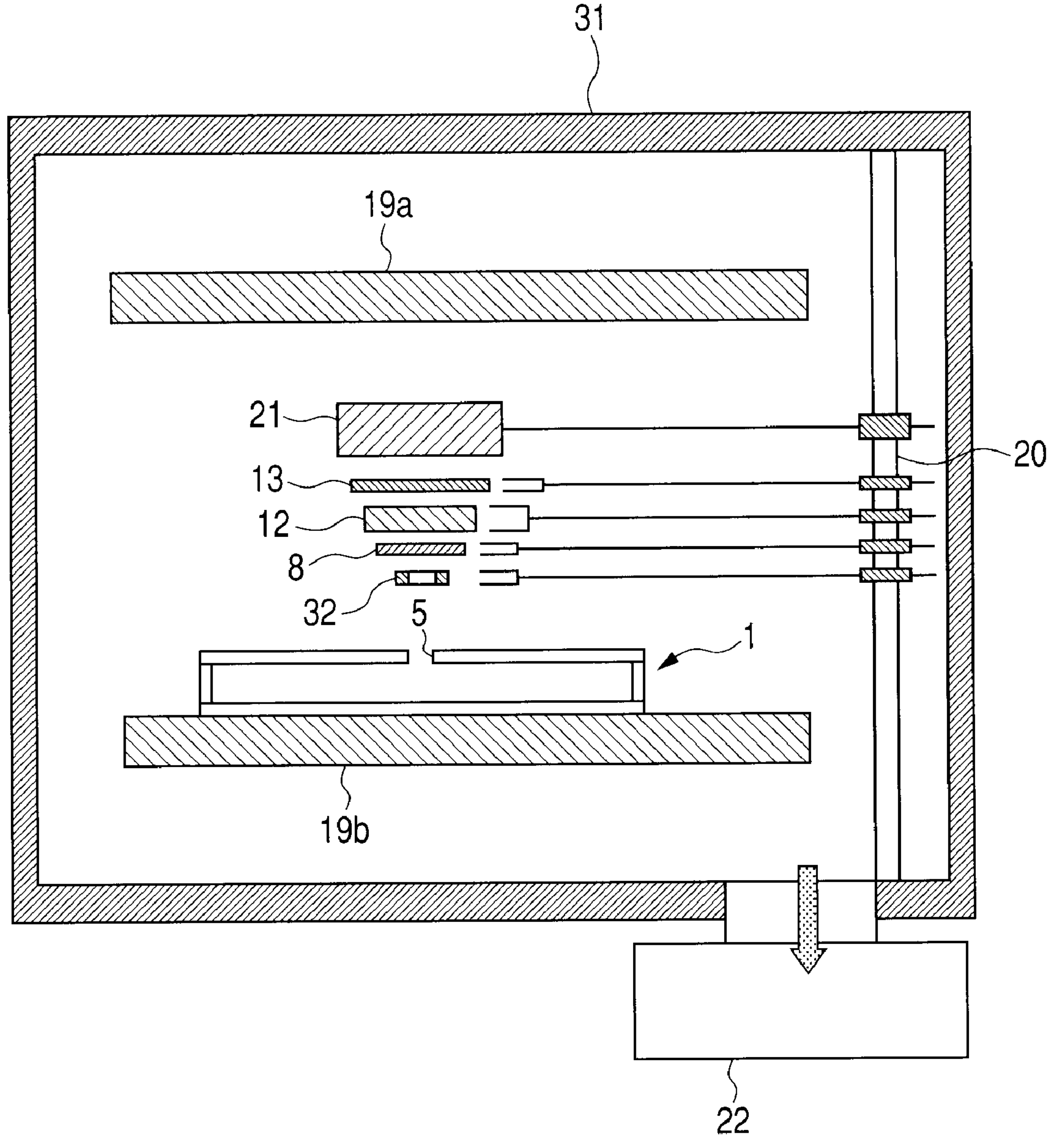
FIG. 3 is a view indicating the first embodiment.

This is an example of manufacturing an airtight container by using the first embodiment illustrated in FIG. 1. Hereinafter, this example will be described with reference to FIG. 3.

In this example, the container 1 was stored in a vacuum-exhaust chamber 31, and the vacuum-exhaust chamber 31 was then exhausted to be vacuumized by using an exhaust unit 22 containing a turbo molecular pump and a dry scroll pump. Further, heaters 19*a* and 19*b* used as heating units were provided in the vacuum-exhaust chamber 31, and the through-hole 5 having the diameter of 3 mm was provided on the upper surface of the container 1.

As the plate member 8, a soda lime glass having the diameter of 5 mm and the thickness of 300 μm was prepared. As the sealant 12, a glass frit, which was molded to have the diameter of 7 mm and the thickness of 400 μm by pre-baking and from which a paste component had been eliminated, was prepared. As the cover member 13, a soda lime glass having the diameter of 8 mm and the thickness of 800 μm was prepared. As the spacer member 32, soda lime glass having the outside diameter of 4 mm, the bore diameter of 3 mm and the thickness of 800 μm was prepared. As a load applying weight 21, a weight of 150 g made by SUS340 (Steel Use Stainless 340) was prepared. After then, these members were mounted on the rotating/vertical moving mechanism 20 capable of individually performing vertical movement and rotational movement for each of the members, and the mounted members were arranged in the vacuum-exhaust chamber 31.

Process (a)

The exhaust unit 22 was operated to exhaust the inside of the vacuum-exhaust chamber 31, and the vacuum degree of the inside of the container 1 was decreased to a level equal to or less than $1\times10^{-3}$ Pa via the through-hole 5. The heaters 19*a* and 19*b* were operated in correspondence with the exhausting process, and the respective members arranged inside the vacuum-exhaust chamber 31 were heated to 350° C. which is equal to or less than a softening temperature of the glass frit serving as the sealant 12.

Process (b)

The spacer member 32 and the plate member 8 were arranged immediately above the through-hole 5 by using the rotating/vertical moving mechanism 20.

Process (c)

The sealant 12 was arranged immediately above the plate member 8 by using the rotating/vertical moving mechanism 20.

Process (d)

The cover member 13 was arranged immediately above the sealant 12 by using the rotating/vertical moving mechanism 20. After then, the load applying weight 21 was rotationally moved to the position immediately above the cover member 13 by using the rotating/vertical moving mechanism 20. The load applying weight 21 was slowly descended at a speed of 1 mm/min by using the rotating/vertical moving mechanism 20 so that the load was not rapidly added, and then the load applying weight 21 was mounted on the cover member 13.

Process (e)

The heating process was executed to reach a softening temperature of the glass frit.

After then, the load applying weight 21 was cooled to a room temperature while being mounted on the cover member 13, the inside of the vacuum-exhaust chamber 31 was then purged, and the manufactured container 1 was taken out from the vacuum-exhaust chamber 31.

As just described above, the vacuum airtight container of which the through-hole had been sealed by the sealant and the inside had been exhausted to be vacuumized was manufactured. The glass frit was formed closely in the space 14*a* between the cover member 13 and the outer surface 6 of the container 1 and in the space 14*b* between the plate member 8 and the outer surface 6 of the container 1. In this example, the plate member 8 and the spacer member 32 were continuously pressed toward the periphery of the through-hole 5 while the glass frit serving as the sealant was melted and squashed in the process (e) by the fact that the load applying weight 21 was mounted on the cover member 13 in the process (d). For this reason, a fact that the sealant 12 flowed into the through-hole 5 was not confirmed. In addition, since the two places, that is, the periphery of the plate member 8 and the through-hole 5 and the periphery of the cover member 13 and the through-hole 5, were sealed, the vacuum airtight container having sufficient airtightness could be obtained.

Example 2

Figure 4:
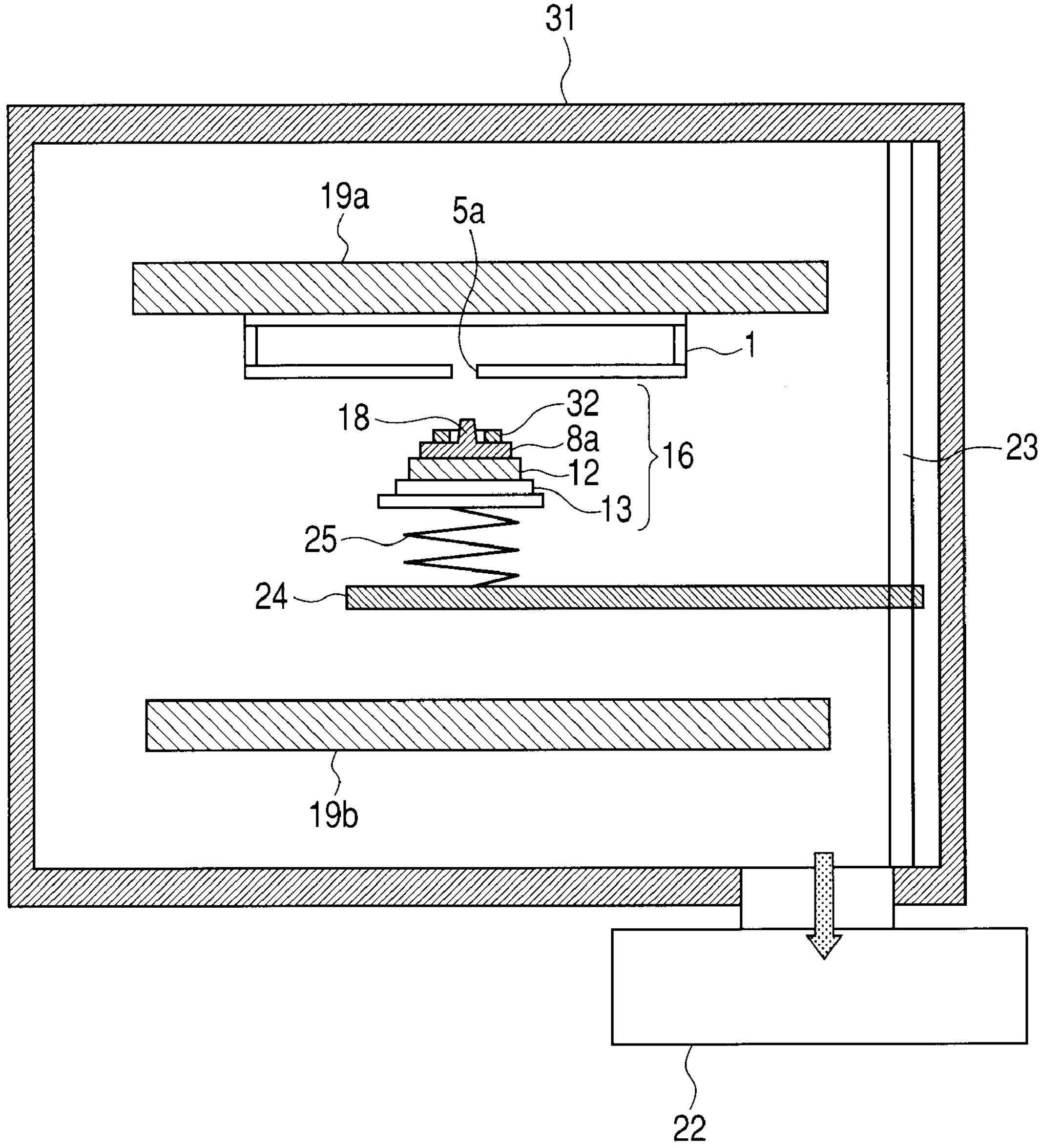
FIG. 4 is a view indicating the second embodiment.
Figure 5A:
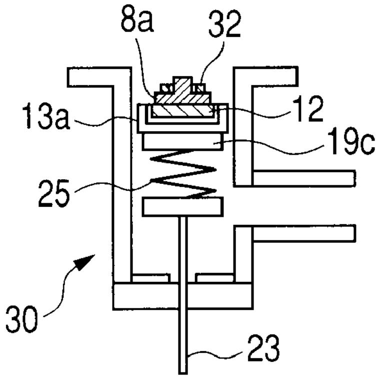
FIGS. 5A, 5B, 5C, 5D and 5E are views indicating the third embodiment.
Figure 5C:
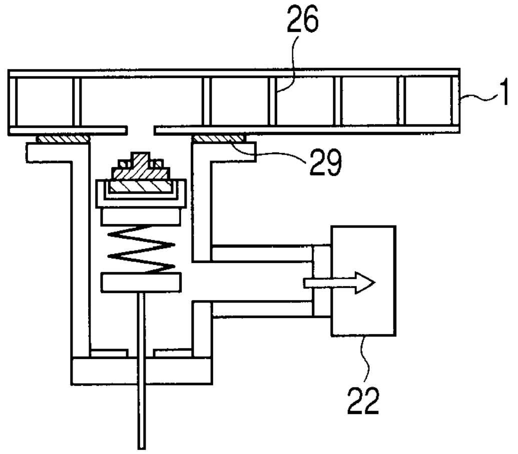
Figure 5B:
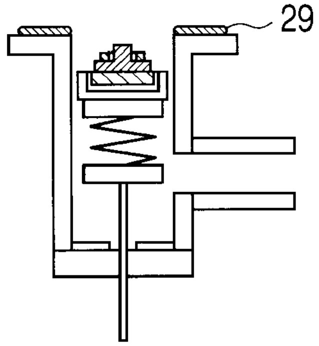
Figure 5D:
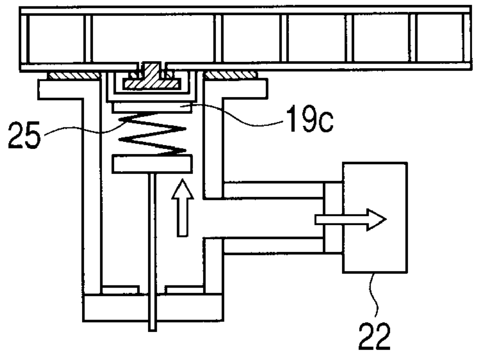
Figure 5E:
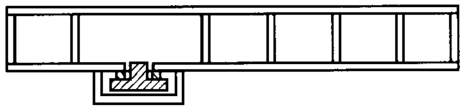
Figure 6:
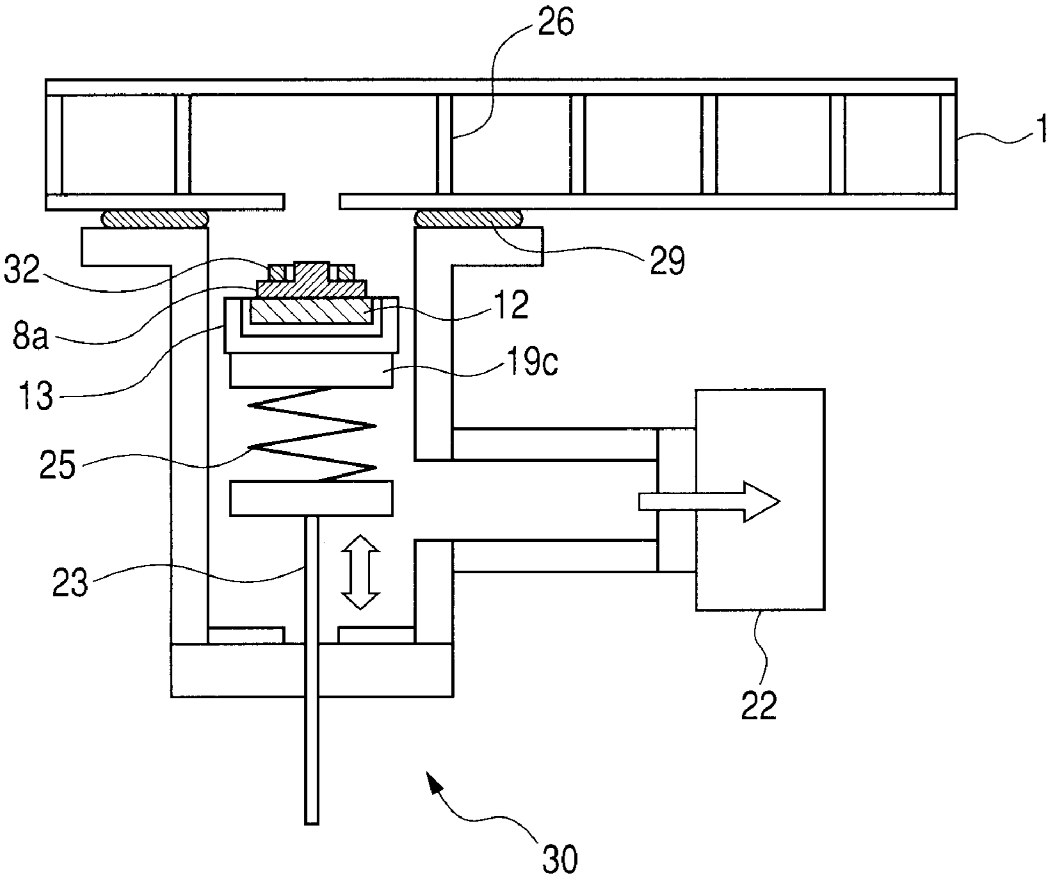
FIG. 6 is a view indicating the third embodiment.

This is an example of manufacturing an airtight container by using the second embodiment indicated in FIG. 2. Hereinafter, this example will be described with reference to FIG. 4.

In this example, the container 1 was stored in a vacuum-exhaust chamber 31, and the vacuum-exhaust chamber 31 was then exhausted to be vacuumized by using an exhaust unit 22 having a turbo-molecular pump and a dry scroll pump. Further, heaters 19*a* and 19*b* used as heating units were provided in the vacuum-exhaust chamber 31. The container 1 had two substrates oppositely arranged each other, and surface conduction electron-emitting devices (not illustrated) were formed on the inner surface of one substrate and an anode electrode and a light emission member (not illustrated) were formed on the inner surface of the other substrate. Further, the container 1 had the through-hole 5*a* having the diameter of 4 mm, on its lower surface.

As the cover member 13, non-alkaline glass having the diameter of 10 mm and the thickness of 500 μm was prepared. The sealant 12 composed of In (indium) and molded to have the diameter of 8 mm and the thickness of 400 μm was provided on the cover member 13. The plate member 8*a* of non-alkaline glass having the diameter of 5 mm and the thickness of 300 μm and having at its center the projection 18 having the diameter of 1 mm and the height of 2 mm was mounted on the sealant 12, and the spacer member 32 of an aluminum alloy having the outside diameter of 4.8 mm, the bore diameter of 4 mm and the thickness of 50 μm was mounted on the plate member 8*a*, whereby the laminated body 16 was prepared. The rotating/vertical moving mechanism 23 was equipped with a stage 24 capable of applying pressing force to be operated in the vertical upward direction by a spring member 25 having the spring constant of about 1N/mm (100 gf/mm). The laminated body 16 set on the stage 24 was arranged in the vacuum-exhaust chamber 31.

Process (a)

Initially, the laminated body 16 was escaped to a position not to be heated by the heaters 19*a* and 19*b*, by using the rotating/vertical moving mechanism 23. Next, the exhaust unit 22 was operated to exhaust the inside of the vacuum-exhaust chamber 31, and the vacuum degree of the inside of the container 1 was decreased to a level equal to or less than $1\times10^{-4}$ Pa via the through-hole 5*a*. The heaters 19*a* and 19*b* were operated in correspondence with the exhausting process, and the container 1 was heated at 350° C. for an hour by the heaters 19*a* and 19*b* to exhaust adsorption gas in the container 1. After that, the heaters 19*a* and 19*b* and the container 1 were naturally cooled to reach the temperature of 100° C.

Process (b)

The laminated body 16 was moved to the position immediately below the through-hole 5*a* by the rotating/vertical moving mechanism 23. Subsequently, a reheating process was performed by the heaters 19*a* and 19*b* while the inside of the vacuum-exhaust chamber 31 was being exhausted continuously. Thus, the container 1, the stage 24 including the spring member 25, and the laminated body 16 were respectively heated to 100° C. being equal to or less than a melting temperature of In, so as to have the same temperature as that of the container 1.

Process (c)

The laminated body 16 held by the stage 24 was slowly moved upward by using the rotating/vertical moving mechanism 23 until the spacer member 32 came into contact with the periphery of the through-hole 5*a* in a state of the projection 18 of the plate member 8*a* being inserted in the through-hole 5*a*. Subsequently, the rotating/vertical moving mechanism 23 was moved upward by 5 mm at a speed of 1 mm/sec so that the plate member 8*a* was pressed by the spring member 25.

Process (d)

The temperatures of the container 1 and the respective members were raised to 160° C., which is equal to or higher than the melting temperature of In, at a speed rate of 3° C./min by the heaters 19*a* and 19*b*. Also, when In was melted, since the respective members were being continuously pressed toward the through-hole 5*a* by the spring member 25, the sealant 12 was deformed according to melting of In, whereby the through-hole 5*a* was sealed.

After then, the temperature was cooled down to the room temperature while the laminated body 16 was being pressed by the spring member 25. Then, the inside of the vacuum-exhaust chamber 31 was purged, and the manufactured container 1 was taken out from the vacuum-exhaust chamber 31.

As just described, in the manufactured airtight container, In was formed closely in the space 14*a* between the cover member 13 and the outer surface 6 of the container 1 and in the space 14*b* between the plate member 8*a* and the outer surface 6 of the container 1. Further, since the pressing by the spring member was continuously performed in the processes (c) and (d), the plate member 8*a* and the spacer member 32 were continuously pressed to the periphery of the through-hole 5*a* while In serving as the sealant 12 was melted and deformed in the process (d). As a result, it was able to prevent the sealant 12 from flowing into the through-hole 5*a*. In addition, since the two places, that is, the periphery of the plate member 8*a* and the through-hole 5*a* and the periphery of the cover member 13 and the through-hole 5*a*, were sealed, the vacuum airtight container having sufficient airtightness could be obtained.

In this manner, an image forming apparatus, of which the inside had been exhausted to be vacuumized, having therein surface conduction electron-emitting devices could be obtained. Although voltage of 15 kV was applied between an anode electrode and a cathode electrode of the image forming apparatus for 24 hours, any electric discharge was not generated in an area of the image forming apparatus and its peripheral area, and it was confirmed that electron accelerating voltage could be stably applied.

Example 3

This is an example of manufacturing an airtight container by using the second embodiment. This example will be described with reference to FIGS. 5A to 5E and FIG. 6.

In this example, the container 1 had a through-hole having the diameter of 2 mm on its lower surface, and had therein a support member (a spacer for withstand atmosphere pressure) 26 so as not to be destroyed even if the load was locally applied to the periphery of an aperture from the outside of the container. A flange 30 serving as an exhaust pipe and having the bore diameter larger than that of the through-hole had therein the rotating/vertical moving mechanism 23 according to a straight line manipulator, the spring member 25 and an internal heater 19*c* connected to the spring member. If the heater was pressed to the container side by the rotating/vertical moving mechanism, the load could be applied according to a pressing degree. In addition, the exhaust unit 22 having the turbo-molecular pump and the dry scroll pump was connected to the flange 30, so as to be able to exhaust the inside of the flange 30 to be vacuumized.

The plate member 8*a*, which had a projection having the diameter of 1.9 mm and the height of 500 μm on a disc-like plate having the diameter of 5 mm and the height of 500 μm, was formed by PD-200 available from Asahi Glass Co., Ltd. The sealant 12 was formed from an alloy of In and Ag molded to have the diameter of 5 mm and the thickness of 1.45 mm. As a cover member 13*a*, a tray-like member having a concave portion having the diameter of 7 mm and the depth of 1 mm was formed by PD-200. As the spacer member 32, a ring-like member having the outside diameter of 3 mm, the bore diameter of 2 mm and the thickness of 50 μm was formed by an aluminum alloy. Then, the spacer member 32, the plate member 8*a*, the sealant 12 and the cover member 13*a* were laminated mutually in this order to form the laminated body, and the formed laminated body was arranged within the exhaust pipe.

Process (a)

The cover member 13*a*, the sealant 12, the plate member 8*a* and the spacer member 32 were sequentially laminated and arranged on the internal heater 19*c* arranged inside the flange 30 so that the centers of the respective diameters of these members were coincided with others.

Process (b)

An O-ring 29 composed of a material Viton® (registered trademark) was arranged on the aperture of the flange 30.

Process (C)

Vacuum exhaust was started by the exhaust unit 22 while the O-ring 29 was being pressed by the container 1 and the flange 30 at a position where the O-ring 29 was in contact with the periphery of the through-hole 5*a* of the container 1 and the centers of the diameters of the respective members in the process (a) coincided with the center of the through-hole 5*a*. Thus, the inside of the container 1 was exhausted to be vacuumized.

Process (d)

After the internal heater 19*c* in the flange 30 was heated up to 150° C. and held, the temperature was raised to 170° C. at a speed rate of 1° C./min. Subsequently, the laminated body composed of the spacer member 32, the plate member 8*a*, the sealant 12 and the cover member 13*a* was moved along the exhaust pipe by elevating the rotating/vertical moving mechanism in the flange at a speed of 1 mm/min, and the laminated body was pressed to the outer surface of the container while being arranged so as to close up through-hole.

Process (e)

After then, the internal heater 19*c* was naturally cooled to the room temperature while the state of applying the press force in the process (d) was kept. Then, after the sealant 12 was hardened, the exhausting process by the exhaust unit 22 was stopped, the inside of the flange 30 was purged by air, and then the O-ring 29 was separated from the container 1.

As just described, the container was sealed by bonding the outer surface of the container to the cover member and bonding the outer surface of the container to the plate member respectively via the sealant, and the vacuum airtight container of which the inside had been exhausted to be vacuumized was manufactured. Incidentally, in the process (d), since the plate member 8*a* and the spacer member 32 were continuously pressed toward the through-hole 5*a* while the sealant 12 was being melted and deformed, it was able to prevent the sealant 12 from flowing into the through-hole 5*a*. In addition, since the two places, that is, the periphery of the plate member 8*a* and the through-hole 5*a* and the periphery of the cover member 13*a* and the through-hole 5*a*, were sealed, the vacuum airtight container having sufficient airtightness could be obtained. Further, in this example, since the tray shape of the cover member 13*a* was formed so as to hold the plate member 8*a* and the spacer member 32 in a state that the side wall of the tray shape was in contact with the outer surface 6 of the container 1, it was able to prevent the sealant 12 from overflowing outside the tray shape of the cover member. Furthermore, in this example, the capacity of the inside of the tray shape (i.e., the capacity of the concave portion) of the cover member 13*a* and the sum of the volume of the plate member 8*a* held inside the tray shape of the cover member 13*a* and the volume of the sealant were aligned. For this reason, the sealant was formed closely in the inside (i.e., the concave portion) of the cover member 13*a*, an appearance with the sealant not overflowing outside the cover member 13*a* was obtained. Further, as compared with a case of arranging the whole of the container 1 within the vacuum chamber, when the plural vacuum airtight containers were continuously manufactured, it was possible to only connect the container 1 at the portion of the O-ring 29 and exhaust the insides of the flange and the container, whereby the inner capacity to be exhausted and vacuumized was small. For this reason, since a time required for exhaust could be shortened, a total manufacturing time could be shortened.

Example 4

This is an example of manufacturing an airtight container of an image displaying apparatus by partially modifying the second embodiment. In any case, this example will be described with reference to FIG. 7.

Figure 7:
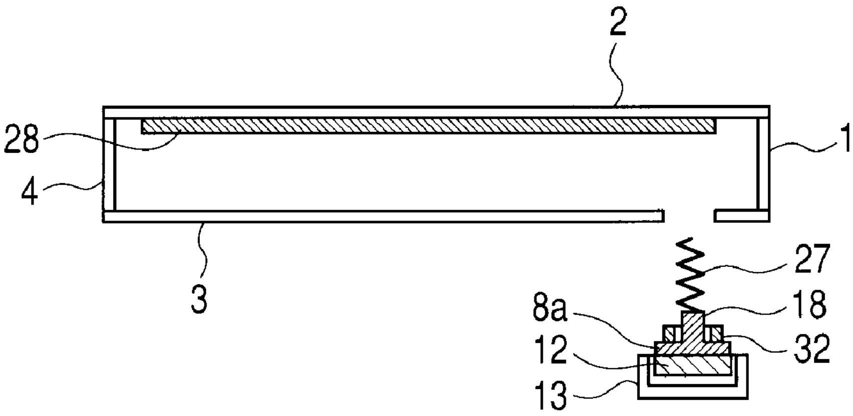
FIG. 7 is a view indicating the fourth embodiment.

In this example, as indicated in FIG. 7, an anode electrode 28 was provided inside the container 1 serving as an envelope, and a spring terminal 27 serving as a terminal unit composed of a conductive material was provided on the plate member 8*a* having the projection. Incidentally, it should be noted that the constitution in this example is similar to that in the example 2 except that the spring terminal 27 was provided and the materials of the plate member and the cover member were respectively different. As well as the example 2, the container 1 was held in the vacuum-exhaust chamber 31, and the vacuum-exhaust chamber 31 was exhausted to be vacuumized by using the exhaust unit 22 having the turbo-molecular pump and the dry scroll pump. The heaters 19*a* and 19*b* were included in the vacuum-exhaust chamber 31 as the heating units. Further, as indicated in FIG. 7, the container 1 had the face plate 2 and the rear plate 3 opposite to each other. Furthermore, surface conduction electron-emitting devices (not illustrated) were formed on the inner surface of the rear plate 3 having the through-hole, and the anode electrode 28 and light emission members (not illustrated) were formed on the inner surface of the face plate 2. Further, an envelope (the container 1) was formed so that the surface-conduction electron-emitting devices, the anode electrode and the light emission members were arranged in the envelope. The container 1 had the through-hole 5*a* having the diameter of 2 mm on its lower surface, and the distance from the outside of the hole to the anode electrode was 3.4 mm.

In FIG. 7, an Fe—Ni alloy, having the diameter of 6 mm and the thickness of 1 mm, which had the tray shape having the diameter of 4.6 mm and the depth of 0.6 mm was prepared as the cover member 13.

On the cover member 13, the sealant 12 of In molded to have the diameter of 4 mm and the thickness of 0.25 mm was provided. On the sealant 12, the plate member 8*a* of Fe—Ni allow, which had the diameter of 4.4 mm and the thickness of 0.45 mm and had at its center the projection 18 having the diameter of 1.8 mm and the height of 0.8 mm, was provided. Here, the spring terminal 27 made by a conductive material was welded to the upper portion of the projection. On the plate member 8*a*, the spacer member 32 of aluminum alloy having the outside diameter of 2.4 mm, the bore diameter of 1.85 mm and the thickness of 50 μm was laminated, whereby the laminated body 16 was prepared. The length of the spring terminal was 4 mm. The rotating/vertical moving mechanism 23 was equipped with the stage 24 capable of applying the press force to be operated in the vertical upward direction by the spring member 25 having the spring constant of about 1N/mm (100 gf/mm). Then, the laminated body 16 set on the stage 24 was arranged in the vacuum-exhaust chamber 31.

Process (a)

Initially, the laminated body 16 was arranged to a position not to be heated by the heaters 19*a* and 19*b*, by the rotating/vertical moving mechanism 23. Next, the exhaust unit 22 was operated to exhaust the inside of the vacuum-exhaust chamber 31, and the vacuum degree of the inside of the container 1 was decreased to a level equal to or less than $1\times10^{-4}$ Pa via the through-hole 5*a*. The heaters 19*a* and 19*b* were operated in conformity with the exhausting process, and the container 1 was heated at 350° C. for an hour by the heaters 19*a* and 19*b* to exhaust adsorption gas in the container 1. After then, the heaters 19*a* and 19*b* and the container 1 were naturally cooled to reach the temperature of 100° C.

Process (b)

The laminated body 16 was moved to the position immediately below the through-hole 5*a* by the rotating/vertical moving mechanism 23. Subsequently, a reheating process was performed by the heaters 19*a* and 19*b* while the inside of the vacuum-exhaust chamber 31 was being exhausted continuously. Thus, the container 1, the stage 24 including the spring member 25, and the respective members of the laminated body 16 were respectively heated to 100° C. being equal to or less than a melting temperature of In, so as to have the same temperature as that of the container 1.

Process (c)

The laminated body 16 held by the stage 24 was slowly moved upward by using the rotating/vertical moving mechanism 23 until the spacer member 32 came into contact with the periphery of the through-hole 5*a* in a state of the projection 18 of the plate member 8*a* being inserted in the through-hole 5*a*. Subsequently, the rotating/vertical moving mechanism 23 was moved upward by 5 mm at a speed of 1 mm/sec so that the plate member 8*a* was pressed by the spring member 25.

Process (d)

The temperatures of the container 1 and the respective members were raised to 160° C., which is equal to or higher than the melting temperature of In, at a speed rate of 3° C./rain by the heaters 19*a* and 19*b*. Also, when In was melted, since the respective members were being continuously pressed toward the through-hole 5*a* by the spring member 25, the sealant did not flow into the through-hole even if the sealant 12 was deformed according to the melting of In, whereby the container 1 was sealed. In this case, as described above, since the sum of the length of the spring terminal 27 and the length of the projection 18 of the plate member was larger than the distance between the outer surface of the rear plate and the anode electrode, the spring member serving as a terminal unit was fixed in the state that the spring member kept shortened by 1.6 mm was in contact with the anode electrode 28.

After then, the temperature was cooled down to the room temperature while the laminated body 16 was being pressed by the spring member 25. Then, the inside of the vacuum-exhaust chamber 31 was purged, and the manufactured container 1 was taken out from the vacuum-exhaust chamber 31.

As just described, in the manufactured airtight container, In having the thickness of 600 μm was formed closely between the cover member 13 and the outer surface 6 of the container 1. Further, since the pressing by the spring member was continuously performed in the processes (c) and (d), the plate member 8*a* was continuously pressed to the periphery of the through-hole 5*a* while In serving as the sealant 12 was melted and deformed in the process (d). As a result, it was able to prevent the sealant 12 from flowing into the through-hole 5*a*. In addition, since the two places, that is, the periphery of the plate member 8*a* and the through-hole 5*a* and the periphery of the cover member 13 and the through-hole 5*a*, were sealed, the vacuum airtight container having sufficient airtightness could be obtained.

In this manner, an image forming apparatus, of which the inside had been exhausted to be vacuumized, having therein surface conduction electron-emitting devices could be obtained. Incidentally, the spring terminal 27 made by the conductive material was held in the state that the sprint terminal 27 was in contact with the anode electrode 28 in the image displaying apparatus. Further, since the plate member 8*a* welded with the spring terminal 27 was the Fe—Ni alloy, the sealant 12 was In, and the cover member 13 was also the Fe—Ni alloy, then the cover member 13 and the anode electrode 28 are electrically conductive. In this example, in the manufacture of the vacuum airtight container, the conductive electrode to the inside of the vacuum container could be made at the same time when the container was sealed. Incidentally, in this example, the envelope of the image displaying apparatus was manufactured by using the laminated body obtained by laminating the spacer member, the plate member, the sealant and the cover member. However, the manufacturing method is not limited to this. That is, this method is also applicable to the method described in the first embodiment, and, in this case, the same effect can be obtained.

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-012911, filed Jan. 23, 2009, which is hereby incorporated by reference herein in its entirety.

What is claimed is:

1. An airtight container manufacturing method comprising the steps of:

exhausting an inside of a container through a through-hole provided in the container;

arranging a spacer member along a periphery of the through-hole on an outer surface of the container, inside of which has been exhausted;

arranging a plate member so that the spacer member and the through-hole are covered by the plate member, and a gap is formed along a side surface of the spacer member between the plate member and the outer surface of the container; and sealing the container by arranging a cover member so as to cover the plate member and by bonding the arranged cover member and the outer surface of the container to each other via a sealant positioned between the cover member and the outer surface of the container, wherein the sealing includes hardening the sealant after deforming the sealant by pressing the plate member with the cover member so that the gap is infilled with the sealant.

2. The airtight container manufacturing method according to claim 1, further comprising the step of heating at least one of the spacer member, the plate member and the cover member before deforming the sealant.

3. The airtight container manufacturing method according to claim 1, wherein deforming the sealant includes pressing the sealant by the cover member by rotating the cover member around an axis being in parallel with a direction in which the sealant is pressed.

4. The airtight container manufacturing method according to claim 1, wherein the plate member has a projection capable of being inserted into the through-hole, and the plate member is in contact with the spacer member and the spacer member is in contact with the outer surface of the container, in a state that the projection is being inserted into the through-hole.

5. The airtight container manufacturing method according to claim 1, wherein a plane area of the cover member is larger than a plane area of the plate member.

6. A manufacturing method of an image displaying apparatus, comprising manufacturing an envelope, inside of which has been vacuumized, by using an airtight container manufacturing method described in claim 1.

7. The manufacturing method of an image displaying apparatus, according to claim 6, wherein an anode electrode is further provided in the envelope, the plate member has a terminal portion including a conductive material, and the sealing is performed in a state that the terminal portion is in contact with the anode electrode.

* * * * *